(12) United States Patent
Zhang

(10) Patent No.: US 9,905,787 B2
(45) Date of Patent: Feb. 27, 2018

(54) ARRAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventor: Xuehui Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 241 days.

(21) Appl. No.: 13/824,605

(22) PCT Filed: Nov. 19, 2012

(86) PCT No.: PCT/CN2012/084849
§ 371 (c)(1),
(2) Date: Mar. 18, 2013

(87) PCT Pub. No.: WO2013/127200
PCT Pub. Date: Sep. 6, 2013

(65) Prior Publication Data
US 2014/0070181 A1 Mar. 13, 2014

(30) Foreign Application Priority Data
Feb. 27, 2012 (CN) .......................... 2012 1 0046972

(51) Int. Cl.
G02F 1/13 (2006.01)
G02F 1/1362 (2006.01)
(Continued)

(52) U.S. Cl.
CPC ........ *H01L 51/0541* (2013.01); *G02F 1/1368* (2013.01); *H01L 27/1288* (2013.01);
(Continued)

(58) Field of Classification Search
CPC ............. H01L 29/7869; H01L 27/1225; H01L 29/66969; H01L 21/02565;
(Continued)

(56) References Cited

U.S. PATENT DOCUMENTS 7,357,878 B2 * 4/2008 Park .......................... C23F 1/30
216/101
8,063,405 B2 * 11/2011 Yagi .................. G02F 1/133345
257/40

(Continued)

FOREIGN PATENT DOCUMENTS

CN 1508614 A 6/2004
CN 101105615 A 1/2008
(Continued)

OTHER PUBLICATIONS

First Chinese Office Action dated Feb. 27, 2014; Appln. No. 201210046972.5.
(Continued)

*Primary Examiner* — Mary Wilczewski
*Assistant Examiner* — Tsz Chiu
(74) *Attorney, Agent, or Firm* — Ladas & Parry LLP

(57) ABSTRACT

According to embodiments of the present invention, there are provided an array substrate, a method for manufacturing the same and a display device, capable of reducing production difficulty of the array substrate. The manufacturing process of the array substrate is simplified, and the production cost is reduced. The array substrate comprises thin film transistor in a top-gate, bottom-contact configuration which is located on a substrate. Regarding the thin film transistor, its gate electrode is connected to a gate line, its source electrode is connected to a data line, and its drain electrode is connected to a pixel electrode.

8 Claims, 6 Drawing Sheets

(51) Int. Cl.
    H01L 51/05     (2006.01)
    H01L 29/66     (2006.01)
    H01L 27/12     (2006.01)
    G02F 1/1368    (2006.01)
    H01L 27/28     (2006.01)
    H01L 51/10     (2006.01)
    H01L 29/786    (2006.01)

(52) U.S. Cl.
    CPC ...... *H01L 27/283* (2013.01); *H01L 29/66757* (2013.01); *H01L 29/7869* (2013.01); *H01L 51/102* (2013.01); *H01L 51/105* (2013.01); *G02F 2001/13685* (2013.01)

(58) Field of Classification Search
    CPC ........... H01L 21/02631; H01L 51/0053; H01L 51/0056; H01L 51/0541; H01L 51/0545
    USPC ........ 257/59, 43, 350, 72, E27.132, E29.276
    See application file for complete search history.

(56) References Cited

U.S. PATENT DOCUMENTS

| | | | |
|---|---|---|---|
| 2002/0056838 A1* | 5/2002 | Ogawa | G02F 1/13439 257/59 |
| 2004/0125261 A1* | 7/2004 | Lee | G02F 1/136209 349/43 |
| 2004/0150759 A1* | 8/2004 | Nishino | G02F 1/136213 349/38 |
| 2004/0239838 A1* | 12/2004 | Lai | G02F 1/1368 349/106 |
| 2008/0049158 A1 | 2/2008 | Choi | |
| 2008/0116474 A1* | 5/2008 | Choung | H01L 27/1214 257/98 |
| 2009/0111198 A1 | 4/2009 | Fujikawa et al. | |
| 2009/0174835 A1 | 7/2009 | Lee et al. | |
| 2010/0295049 A1 | 11/2010 | Yoo et al. | |
| 2011/0031499 A1* | 2/2011 | Kimura et al. | 257/59 |
| 2011/0079777 A1* | 4/2011 | Akimoto | 257/43 |
| 2013/0134399 A1 | 5/2013 | Zhang et al. | |

FOREIGN PATENT DOCUMENTS

| | | |
|---|---|---|
| CN | 101131517 A | 2/2008 |
| CN | 101894807 A | 11/2010 |
| CN | 202025170 U | 11/2011 |
| CN | 102637636 A | 8/2012 |
| CN | 102655155 A | 9/2012 |

OTHER PUBLICATIONS

Second Chinese Office Action dated Sep. 10, 2014; Appln. No. 201210046972.5.

International Search Report; dated Feb. 28, 2013; PCT/CN2012/084849.

* cited by examiner

ARRAY SUBSTRATE, METHOD FOR MANUFACTURING THE SAME AND DISPLAY DEVICE

TECHNICAL FIELD

Embodiments of the present invention relate to an array substrate, a method for manufacturing the same, and a display device.

BACKGROUND

Transistors function as switching devices and driving devices to control and drive a flat panel display, such as, a liquid crystal display, an electroluminescent display, or the like. Currently, the widely used transistors in an array substrate of the liquid crystal display are thin film transistors in a bottom-gate, bottom-contact configuration and thin film transistors in a bottom-gate, top-contact configuration.

As shown in FIG. 1, a gate electrode 1 of a thin film transistor in the bottom-gate, bottom-contact configuration is fabricated on a substrate 3, on top of the gate electrode 1 is a gate insulation layer 4, and source and drain electrodes 2 are located between the gate insulation layer 4 and a semiconductor thin film 5. Boundaries of the source and drain electrodes 2 in this structure may affect the deposition of the semiconductor thin film 5, so that molecular arranging regularity of the semiconductor thin film 5 is degraded. Thus, the transportation of its carriers is disadvantageously affected, so that properties of the device are degraded, and in turn, the quality of the array substrate is affected.

As shown in FIG. 2, a gate electrode 1 of a thin film transistor in the bottom-gate, top-contact configuration is fabricated on a substrate 3 likewise, on top of the gate electrode 1 is a gate insulation layer 4, a semiconductor thin film 5 is fabricated over the gate insulation layer 4, and metal electrodes are further grown on the semiconductor thin film 5 to form source and drain electrodes 2. The manufacturing process of the source and drain electrodes 2 in this structure is largely restricted, and the organic semiconductor thin film which has already have good arranging regularity may be damaged upon fabrication of the source and drain electrodes 2. Generally, the electrodes can only be formed by means of thermal evaporation, and the difficulty of production is relatively high.

As for the existing array substrates with thin film transistors in the bottom-gate, bottom-contact configuration and the bottom-gate, top-contact configuration, photolithography and masking are needed to be performed for many times during fabrication, thus the fabricating process is tedious, and the production costs are relatively high.

SUMMARY

An array substrate and a method for manufacturing the same are provided in embodiments of the invention. In the array substrate, a thin film transistor in a top-gate, bottom-contact configuration is employed so as to reduce production difficulty of the array substrate and improve the quality of the array substrate. Moreover, the manufacturing process of the array substrate is simplified, and production costs are reduced.

According to an embodiment of the invention, there is provided an array substrate, comprising: a substrate, and a gate line, a data line, a thin film transistor and a pixel electrode which are located on the substrate, wherein the thin film transistor is a thin film transistor in a top-gate, bottom-contact configuration, and of the thin film transistor in the top-gate, bottom-contact configuration, a gate electrode is connected to the gate line, a source electrode is connected to the data line, and a drain electrode is connected to the pixel electrode.

In the array substrate, for example, the drain electrode of the thin film transistor is composed of upper and lower electrodes in two layers respectively, and the lower electrode and the pixel electrode is of an integral construction.

In the array substrate, for example, each of the source electrode and the drain electrode of the thin film transistor in the top-gate, bottom-contact configuration is composed of upper and lower electrodes in two layers respectively, and one end of the lower electrode contacting a semiconductor layer of the thin film transistor in the top-gate, bottom-contact configuration partially sticks out from the upper electrode.

In the array substrate, for example, the data line includes upper and lower conductive materials in two layers, and the conductive materials in two layers are the same as materials of the source and drain electrodes of the thin film transistor in the top-gate, bottom-contact configuration and the pixel electrode, respectively.

In the array substrate, for example, the thin film transistor in the top-gate, bottom-contact configuration is an organic thin film transistor in the top-gate, bottom-contact configuration.

According to an embodiment of the invention, there is provided a method for manufacturing an array substrate, comprising:

forming a pattern including source and drain electrodes, a pixel electrode and a data line on a substrate through a first patterning process;

forming a pattern including a semiconductor layer, a gate insulation layer, a gate electrode and a gate line through a second patterning process on the substrate subjected to the first patterning process; and forming a pattern including a passivation layer and a passivation layer via hole through a third patterning process on the substrate subjected to the second patterning process.

In the manufacturing method, for example, forming of the pattern including the source and drain electrodes, the pixel electrode and the data line on the substrate through the first patterning process includes:

forming a transparent conductive film and a metal film on the substrate in sequence;

coating a layer of photoresist on the metal film;

performing exposure and development on the photoresist with a half-tone or gray-tone mask plate so as to form a fully-retained area, a partially-retained area and a fully-removal area, the fully-retained area being adapted for formation of the pattern of the source and drain electrodes of a thin film transistor and the pattern of the data line, the partially-retained area being adapted for formation of the pattern of the pixel electrode and a semiconductor contact area which functions to make the pattern of the source and drain electrodes of the thin film transistor sufficiently contact with the pattern of the semiconductor layer of the thin film transistor;

removing the transparent conductive film and the metal film in the fully-removal area through an etching process so as to form the pattern of the pixel electrode, the pattern of the data line, and lower patterns of the source and drain electrodes for forming the pattern of the source electrode and drain electrode;

removing the photoresist in the partially-retained area through an ashing process;

removing the metal film in the partially-retained area through an etching process, so that the pixel electrode is exposed, and meanwhile, upper patterns of the source electrode and the drain electrode are formed, wherein the upper patterns of the source electrode and the drain electrode and the lower patterns of the source and drain electrodes together constitute the patterns of the source and drain electrodes of the thin film transistor, and a lower electrode of the drain electrode and the pixel electrode are of an integral construction; and removing residual photoresist.

In the manufacturing method, for example, forming of the pattern including the semiconductor layer, the gate insulation layer, the gate electrode and the gate line on the substrate subjected to the first patterning process through the second patterning process comprises:

forming a layer of a semiconductor material, a layer of an insulation material and a layer of a metal material on the substrate subjected to the first patterning process in sequence;

coating a layer of photoresist on the layer of the metal material;

performing exposure and development on the photoresist so as to form a retained area and a removal area of photoresist, the retained area corresponding to a region in which the pattern including the semiconductor layer, the gate insulation layer, the gate electrode and the gate line is to be formed;

removing the semiconductor material, the insulation material and the metal material in the removal area through an etching process, so as to form the pattern including the semiconductor layer, the gate insulation layer, the gate electrode and the gate line; and removing the residual photoresist.

In the manufacturing method, for example, the layer of the semiconductor material is of an organic semiconductor material.

According to an embodiment of the invention, there is provided a display device, comprising the array substrate stated as above.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

REFERENCE NUMERALS

Figure 1:
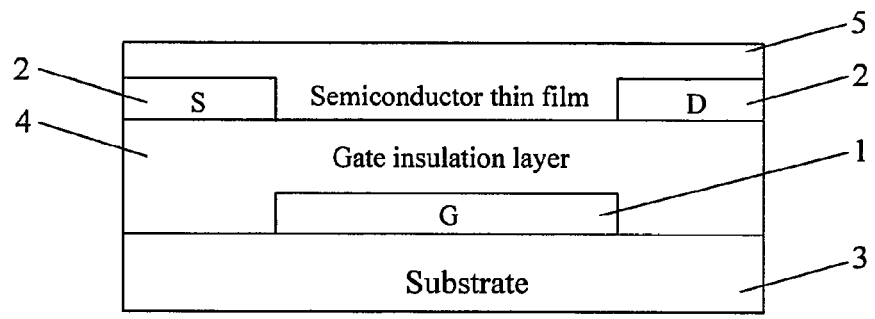
FIG. 1 is a schematic view showing a thin film transistor in a bottom-gate, bottom-contact configuration in prior art.
Figure 2:
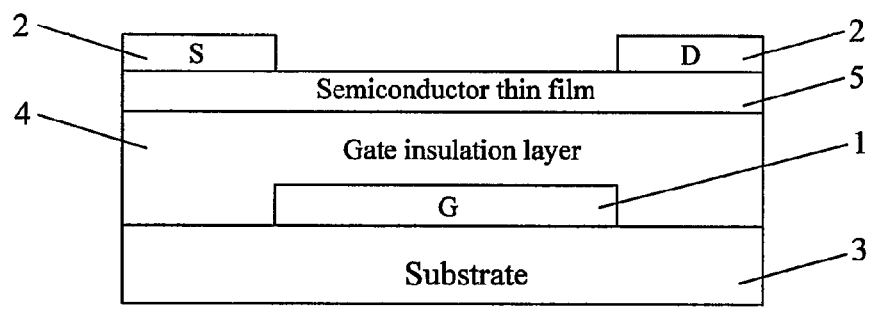
FIG. 2 is a schematic view showing a thin film transistor in a bottom-gate, top-contact configuration in prior art.

| | | |
|---|---|---|
| 11- a substrate | 12- a transparent conductive material | 13- a metal material |
| 19- a pixel electrode | 15- a semiconductor material | 16- an insulation material |
| 17- a gate metal material | 130- a gate line | 110- a data line |
| 38- a pixel electrode pattern | 18- a passivation layer | |
| 14- a thin film transistor in a top-gate, bottom-contact configuration | | |
| 21- a photoresist | 22- a retained area | 211- a fully retained area |
| 212- a partially retained area | 213- a fully removal area | 39- a source electrode |
| 40- a drain electrode | 55- a semiconductor layer | 56- an insulation layer |
| 57- a gate electrode | 33- a source electrode upper pattern | |
| 34- a drain electrode upper pattern | 36- a source electrode bottom pattern | |
| 37- a drain electrode bottom pattern | 110b- a data line upper pattern | |
| 110a- a data line bottom pattern | 120- a gate-line external signal terminal region | |

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as commonly understood by one of ordinary skill in the art to which this invention belongs. Terms such as "first", "second" and the like used in specification and claims of the patent application of the invention do not show any order, number or importance, but are only used to distinguish different constituent parts. Likewise, a term "a," "an," "the" or the like does not indicate limitation in number, but specifies the presence of at least one. Terms such as "comprises," "comprising," "includes," "including", "contains" or the like means that an element or article ahead of this term encompasses element(s) or article(s) listed behind this term and its (their) equivalents, but does not preclude the presence of other elements or articles. Terms such as "connection," "connected," or the like is not limited to physical or mechanical connection, but can include electrical connection, whether directly or indirectly. "Upper," "lower," "left," "right" or the like is only used to describe a relative positional relationship, and when an absolute position of the described object is changed, the relative positional relationship might also be changed accordingly.

An array substrate according to an embodiment of the invention comprises a plurality of gate lines and a plurality of data lines, and these gate lines and data lines cross over each other to thereby define a plurality of pixel units arranged in a matrix, each of which includes a thin film transistor functioning as a switching element and a pixel electrode for controlling arrangement of liquid crystals. For example, for the thin film transistor of each pixel, its gate electrode is electrically connected to or integrally formed with a corresponding gate line, its source electrode is electrically connected to or integrally formed with a corresponding data line, and its drain electrode is electrically connected to or integrally formed with a corresponding pixel electrode. The following descriptions are made mainly with respect to a single pixel unit or a plurality of pixel units, but other pixel unit (s) can be formed in the same way.

Embodiment 1

Figure 3:
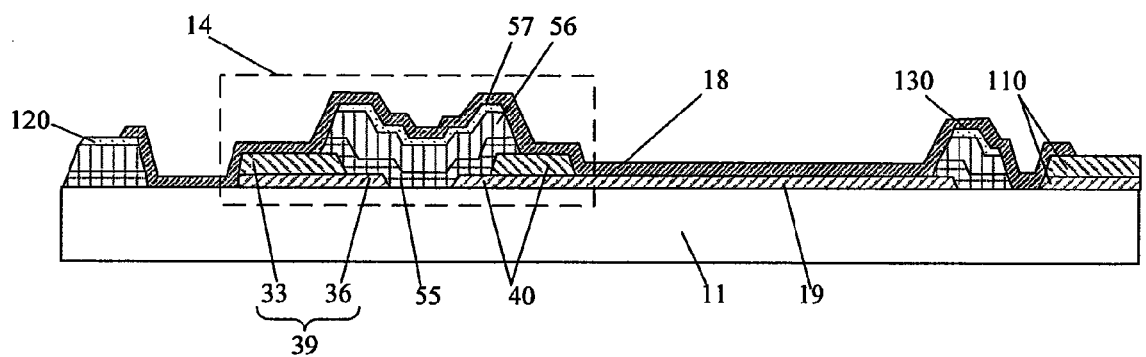
FIG. 3 is a schematically cross-sectional view showing an array substrate in an embodiment of the invention.
Figure 4:
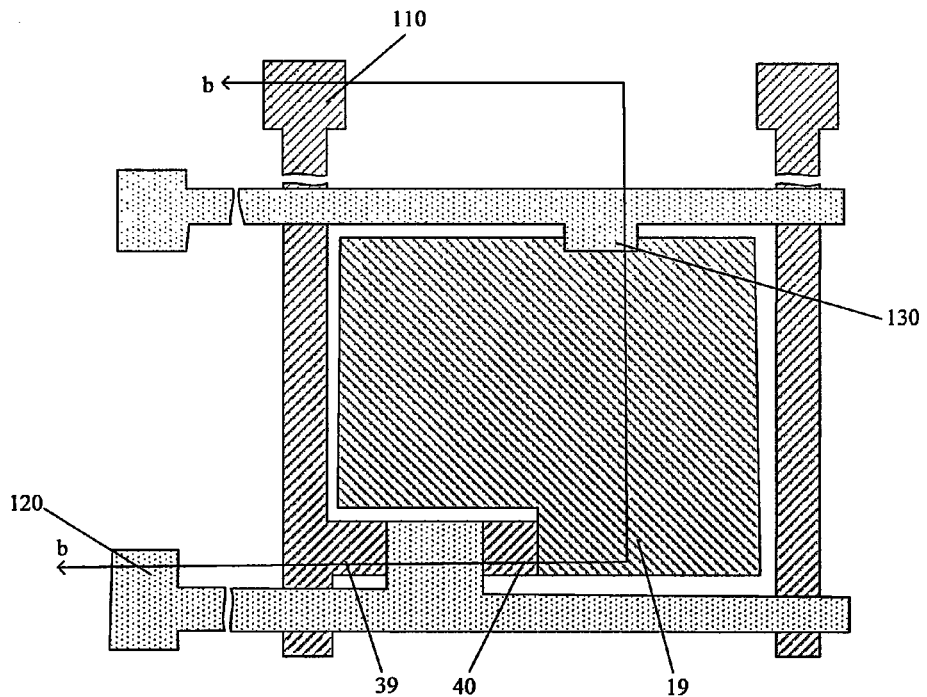
FIG. 4 is a schematically plan view showing the array substrate in the embodiment of the invention.

According to an embodiment of the invention, there is provided an array substrate. As shown in FIGS. 3 and 4, the array substrate comprises: a substrate 11, and a gate line 130, a data line 110, a thin film transistor and a pixel electrode 19 which are located on the substrate 11. The thin film transistor is a thin film transistor 14 in a top-gate, bottom-contact configuration, and for the thin film transistor 14 in the top-gate, bottom-contact configuration, its gate electrode (i.e., a gate electrode pattern 57) is connected to the gate line 130, its source electrode 39 is connected to the data line 110, and its drain electrode 40 is connected to the pixel electrode 19.

Further, the drain electrode 40 of the thin film transistor is composed of upper and lower electrodes in two layers respectively, and the lower electrode and the pixel electrode 19 is of an integral construction. With this structure, better electrical contact between the drain electrode 40 and the pixel electrode 19 can be achieved. Of course, the two may not be of an integral construction, either, details being omitted here.

Further, in the embodiment of the invention, each of the source electrode 39 and the drain electrode 40 of the thin film transistor in the top-gate, bottom-contact configuration is composed of upper and lower electrodes in two layers respectively, and one end of the lower electrode, which contacts the semiconductor layer 55 of the thin film transistor in the top-gate, bottom-contact configuration slightly, sticks out from the upper electrode, therefore capable of directly contacting the semiconductor layer 55.

For example, the source electrode 39 is composed of upper and lower electrodes in two layers respectively, and one end of the lower electrode (i.e., a source electrode bottom pattern 36) contacting the semiconductor layer 55 partially sticks out from the upper electrode (i.e., a source electrode upper pattern 33) by a portion, therefore capable of directly contacting the semiconductor layer 55. The portion which sticks out serves to make sufficient contact between the pattern of the source and drain electrodes of the thin film transistor in the top-gate, bottom-contact configuration and the pattern of the semiconductor layer of the thin film transistor in the top-gate, bottom-contact configuration; therefore, the contact areas between the source and drain electrodes and the semiconductor layer in the thin film transistor are increased as compared to prior art. Moreover, the size of the portion can also be adjusted according to practical requirements so as to achieve different property and results.

Further, in the embodiment, the data line 110 includes conductive materials in upper and lower two layers, and these two layers conductive materials are the same as the materials of the source and drain electrodes and the pixel electrode of the thin film transistor in the top-gate, bottom-contact configuration, respectively; therefore, the data line can be respectively formed together with the source and drain electrodes and the pixel electrode of the thin film transistor in one patterning process. In the gate line 130, the material of the semiconductor layer 55 and the material of a gate insulation layer 56 are retained, and thus the gate line 130 can be formed together with the semiconductor layer 55, the gate insulation layer 56 and the gate electrode 57 of the above thin film transistor in one patterning process.

Further, the organic thin film transistor 14 in the top-gate, bottom-contact configuration, the pixel electrode 19, the gate line 130 and the data line 110 are covered with a passivation layer 18, and external signal terminal regions of the gate line 130 and the data line 110 (i.e., a gate line PAD region 120 and a data line PAD region) are not covered with the passivation layer.

Alternatively, the thin film transistor 14 in the top-gate, bottom-contact configuration is an organic thin film transistor in the top-gate, bottom-contact configuration. That is, the active layer is not formed of a silicon semiconductor (e.g., amorphous silicon, polysilicon or the like) or an oxide semiconductor (e.g., IGZO or the like), but from an organic semiconductor material (e.g., phthalocyanine or the like).

In the embodiment of the invention, a common electrode line (not shown in figures) may further be included, and the common electrode line may be disposed in the same layer as the data line, or may also be disposed in the same layer as the gate line. When the common electrode line is disposed in the same layer as the data line, it may also include the above upper and lower conductive materials in two layers, and this can make resistance of the common electrode line smaller to enhance its capability to transmit a signal. In a twisted nematic (TN) mode, the common electrode line is used to form a storage capacitance, while in an advanced super dimension switch (ADS) or fringe field switching (FFS) structure, it is mainly used to transmit a common voltage.

According to the array substrate provided by the embodiment of the invention, the use of the thin film transistor in the top-gate, bottom-contact configuration facilitates regular growth of a semiconductor thin film on the source and drain electrodes of the thin film transistor and within a channel region, and the production difficulty of the array substrate can be degraded. Furthermore, in the thin film transistor in the top-gate, bottom-contact configuration, the use of the structure of the source and drain electrodes with two-layered electrodes makes the contact areas between the source and drain electrodes and the semiconductor layer larger, so that the properties of the thin film transistor in the top-gate, bottom-contact configuration are improved, and in turn, the properties of the array substrate is improved.

Embodiment 2

Figure 5:
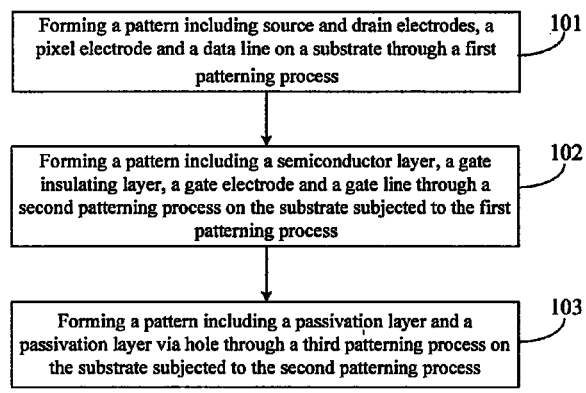
FIG. 5 is a flow chart showing a manufacturing method of an array substrate in an embodiment of the invention.

According to the embodiment of the invention, there is provided a method for manufacturing an array substrate. As shown in FIG. 5, this method comprises the following steps.

Step 101, a pattern including source and drain electrodes, a pixel electrode and a data line is formed on a substrate through a first patterning process;

Step 102, a pattern including a semiconductor layer, a gate insulation layer, a gate electrode and a gate line is formed through a second patterning process on the substrate subjected to the first patterning process; and Step 103, a pattern including a passivation layer and a passivation layer via hole is formed through a third patterning process on the substrate subjected to the second patterning process.

According to the method for manufacturing the array substrate provided by the embodiment of the invention, the source and drain electrodes and the pixel electrode of a thin film transistor in a top-gate, bottom-contact configuration and the data line of the array substrate are formed in the first patterning process; the gate line of the array substrate and the semiconductor layer, the gate insulation layer, and the gate electrode of the thin film transistor are formed in the second patterning process; finally, the passivation layer is further formed by using a patterning process, so that manufacture of the array substrate can be completed with only three patterning processes. As compared to a manufacturing method in prior art, the use amount of the patterning process is decreased and at the same time the properties of the array substrate are ensured, and then damage of the patterning process to the semiconductor thin film is reduced. Furthermore, the process step is simplified, and the production costs are reduced.

Further, in the embodiment of the invention, one example of formation of the pattern including the source and drain electrodes, the pixel electrode and the data line on the substrate through the first patterning process will be described below.

Figure 6:
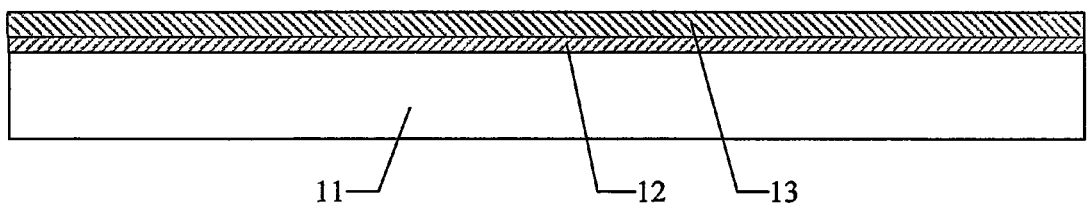
FIG. 6 is a schematic view showing deposition of a conductive material in the embodiment of the invention.

Firstly, as shown in FIG. 6, a transparent conductive material 12 and a metal material 13 are formed on the substrate 11 in sequence;

Alternatively, in the embodiment of the invention, a layer of transparent conductive thin film and a layer of metal thin film are sequentially sputtered on a glass substrate. The transparent conductive thin film is, for example, formed of indium tin oxide (ITO); and a single-layered film or a composite film of aluminum, an aluminum alloy, copper or other conductive material may be used to form the metal thin film.

Then, a layer of photoresist is coated on the metal material 13, and the coating method may be spin-coating.

Figure 7:
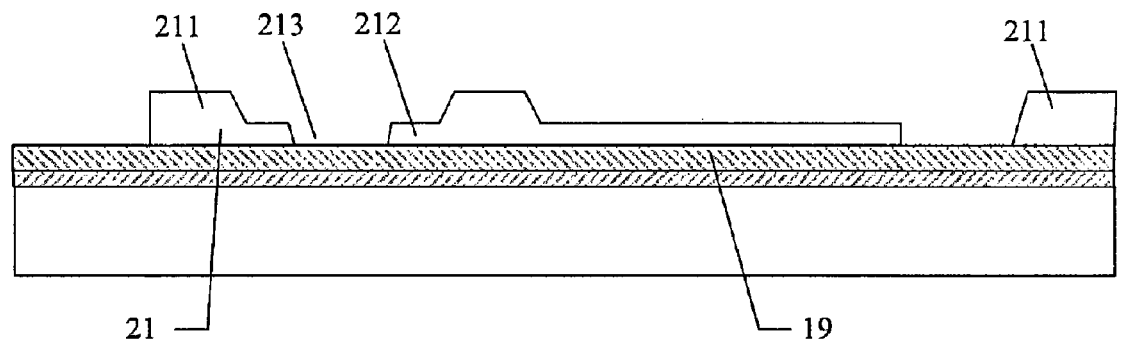
FIG. 7 is a schematic view showing performance of exposure and development with a half-tone mask plate in the embodiment of the invention.

As shown in FIG. 7, exposure and development are preformed on the photoresist 21 with a half-tone or gray-tone mask plate so as to form a fully-retained area 211, a partially-retained area 212 and a fully-removal area 213. The photoresist in the fully-retained area 211 is substantially retained after development for formation of the pattern of the source and drain electrodes of an organic thin film transistor and the pattern of the data line; the photoresist in the partially-retained area 212 is partially retained after development for formation of the pattern of the pixel electrode and a semiconductor contact area; and the photoresist in the fully-removal area 213 is substantially removed after development. The semiconductor contact area serves to make the pattern of the source and drain electrodes of the organic thin film transistor in the top-gate, bottom-contact configuration sufficiently contact with the pattern of the semiconductor layer of the organic thin film transistor.

Figure 8:
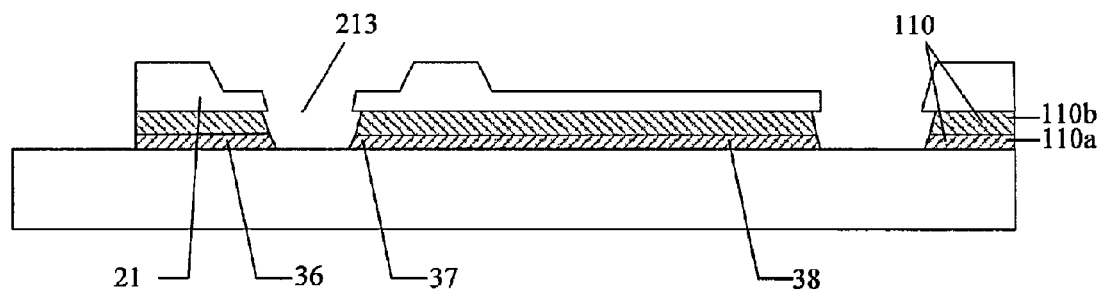
FIG. 8 is a schematic view showing etching for the conductive material in the embodiment of the invention.

Further, as shown in FIG. 8, the transparent conductive material 12 and the metal material 13 in the fully-removal area 213 are removed through an etching process to form a pixel electrode pattern 38, a data line pattern 110 and the bottom (i.e. lower) patterns of the source and drain electrodes for forming pattern of the source and drain electrodes, i.e., a source electrode bottom pattern 36 and a drain electrode bottom pattern 37; the data line upper pattern 110b and the data line bottom pattern 110a together form the data line pattern 110. Because the data line and the source and drain electrodes of the thin film transistor are together formed in one patterning process, the data line 110 comprises upper and lower conductive materials in two layers, which are the same as the materials of the source and drain electrodes and a pixel electrode 19 of the thin film transistor in the top-gate, bottom-contact configuration, and this structure does not affect transmission property of the data line.

Figure 9:
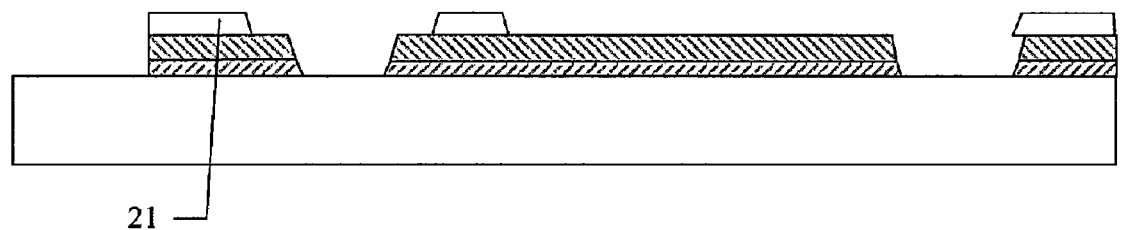
FIG. 9 is a schematic view showing asking for photoresist in the embodiment of the invention.

As shown in FIG. 9, the photoresist 21 in the partially-retained area is removed through an ashing process, and meanwhile the photoresist in the photoresist fully-retained area 22 is thinned down.

Figure 10:
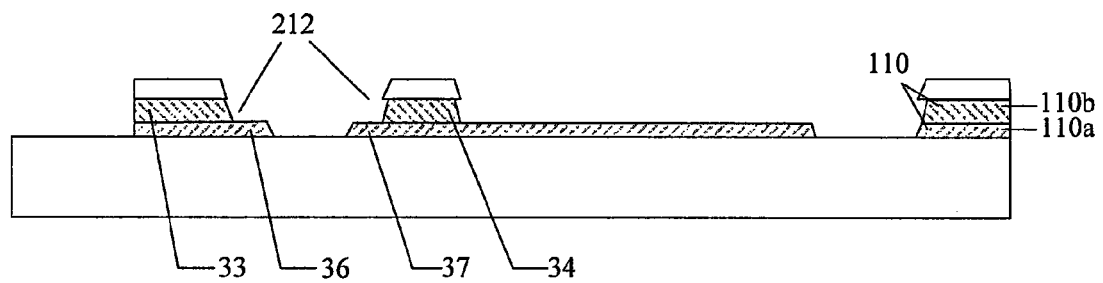
FIG. 10 is a schematic view showing formation of upper patterns of source and drain electrodes in the embodiment of the invention.

Further, as shown in FIG. 10, the metal material in the partially-retained area 212 is removed through an etching process, so that the pixel electrode 19 is exposed, and meanwhile, upper patterns of the source electrode and the drain electrode are formed, i.e., a source electrode upper pattern 33, a drain electrode upper pattern 34. The upper patterns of the source electrode and the drain electrode and the bottom patterns of the source and drain electrodes together form the patterns of the source and drain electrodes of the thin film transistor in the top-gate, bottom-contact configuration, i.e., the source electrode upper pattern 33 and the source electrode bottom pattern 36 form the pattern of the source electrode of the thin film transistor; the drain electrode upper pattern 34 and the drain electrode bottom pattern 37 form the pattern of the drain electrode of the thin film transistor; and a lower electrode of the drain electrode and the pixel electrode are of an integral construction.

In the embodiment of the invention, the source electrode bottom pattern 36 is longer than the source electrode upper pattern 33 by a portion, the portion which sticks out is the semiconductor contact region which functions to make the pattern of the source electrode of the organic thin film transistor in the top-gate, bottom-contact configuration sufficiently contact the pattern of the semiconductor layer of the thin film transistor in the top-gate, bottom-contact configuration. As compared to prior art, the contact areas between the source and drain electrodes and the semiconductor layer in the thin film transistor are increased; moreover, the size of the region can be adjusted according to practical requirements so as to enhance flexibility of production.

Figure 11:
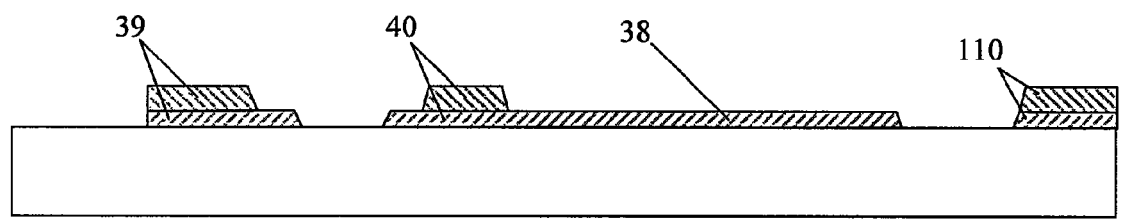
FIG. 11 is a schematically cross-sectional view showing formation of a source-drain electrode layer in the embodiment of the invention.
Figure 12:
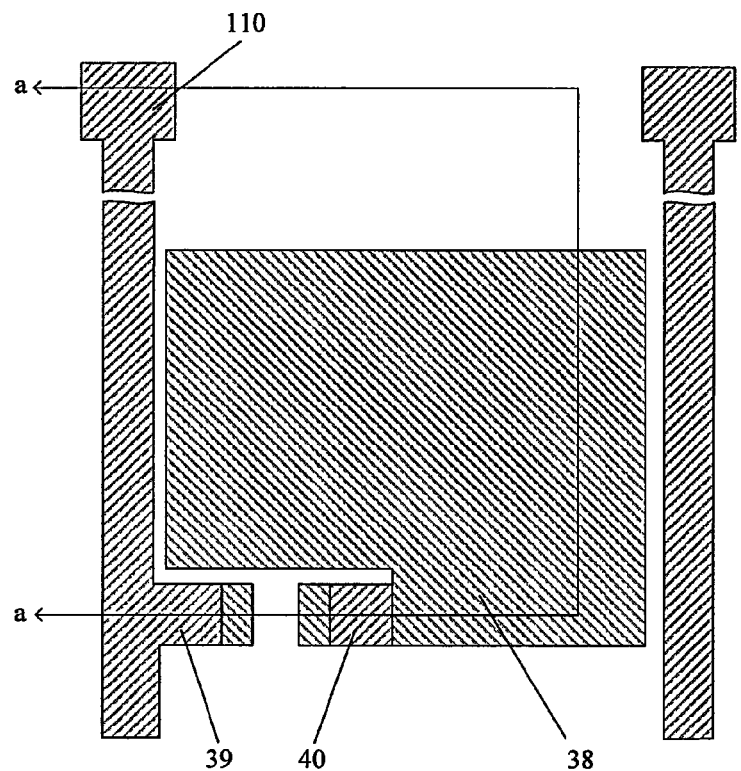
FIG. 12 is a schematically plan view showing formation of the source-drain electrode layer in the embodiment of the invention.

As shown in FIG. 11 and FIG. 12, the residual photoresist is removed and a source-drain electrode layer is formed, that is, a source electrode 39 and a drain electrode 40 of the organic thin film transistor in the top-gate, bottom-contact configuration, the pixel electrode pattern 38 and the data line 110 are formed on the substrate. FIG. 12 is a plan view showing of the array substrate (one pixel unit).

Further, in the embodiment of the invention, one example of forming the pattern including the semiconductor layer, the gate insulation layer, the gate electrode and the gate line is formed through the second patterning process on the substrate subjected to the first patterning process will be described below.

Figure 13:
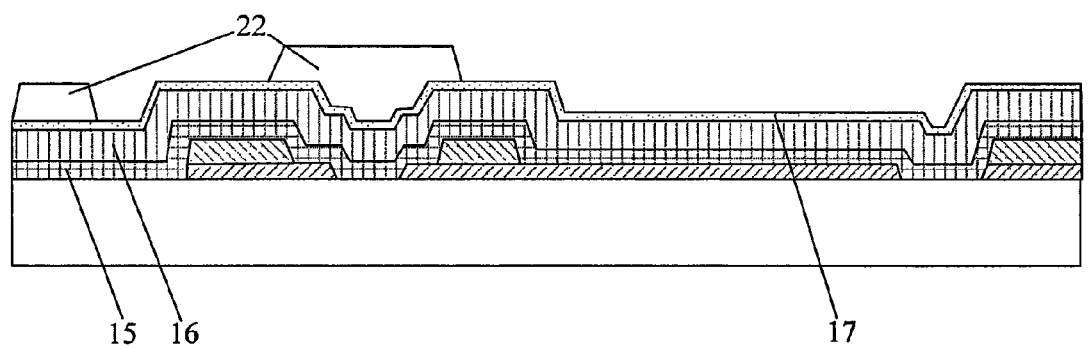
FIG. 13 is a schematic view showing deposition of a material on the source-drain electrode layer in the embodiment of the invention.

As shown in FIG. 13, a semiconductor material layer 15, an insulation material layer 16 and a gate metal material layer 17 are sequentially formed (for example, deposited, sputtered or the like) on the source-drain electrode layer. The semiconductor material layer 15 is formed, such as, of amorphous silicon or an oxide semiconductor material; the insulation material layer 16 is, for example, formed of silicon oxide, silicon nitride, or silicon oxynitride; and the gate metal material layer 17 is, for example, formed as a single-layer film or a composite film of aluminum, an aluminum alloy, copper or other conductive material.

A layer of photoresist is coated on the gate metal material layer 17. The photoresist is subjected to exposure and development so as to form a photoresist retained area 22 and a removal area. The retained area 22 corresponds to a region in which the pattern including the semiconductor layer, the gate insulation layer, the gate electrode and the gate line is to be formed.

Figure 14:
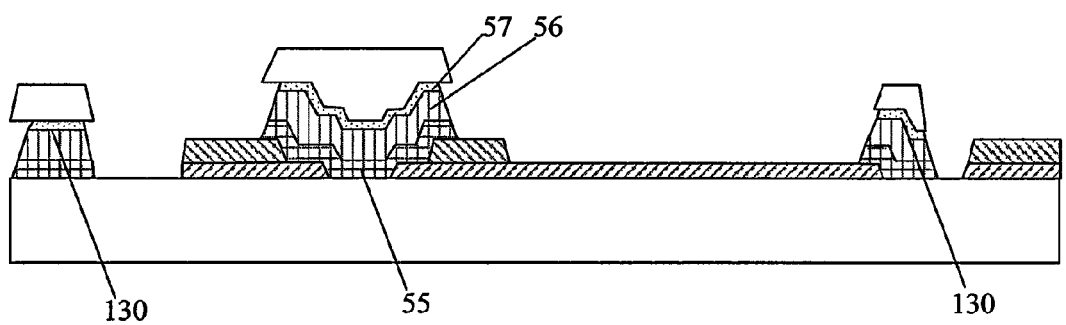
FIG. 14 is a schematic view showing an etching process in the embodiment of the invention.

As shown in FIG. 14, the semiconductor material, the insulation material and the metal material in the removal area are removed through an etching process so as to form patterns including the pattern of a gate line 130 and the pattern of a semiconductor layer 55, a gate insulation layer 56 and a gate electrode 57 of the thin film transistor in the top-gate, bottom-contact configuration.

Further, in the embodiment of the invention, because the gate line 130 is formed together with a semiconductor layer 55, a gate insulation layer 56 and a gate electrode 57 of the above-described thin film transistor in one patterning process, the gate line 130 is composed of three material layers, and these layers are the same as the material of the semiconductor layer 55 of the organic thin film transistor 14 in the top-gate, bottom-contact configuration, the material of the gate insulation layer 56 and the material of the gate electrode 57, respectively. This structure does not affect the transmission property of the gate line, and a further treatment is not required.

Figure 15:
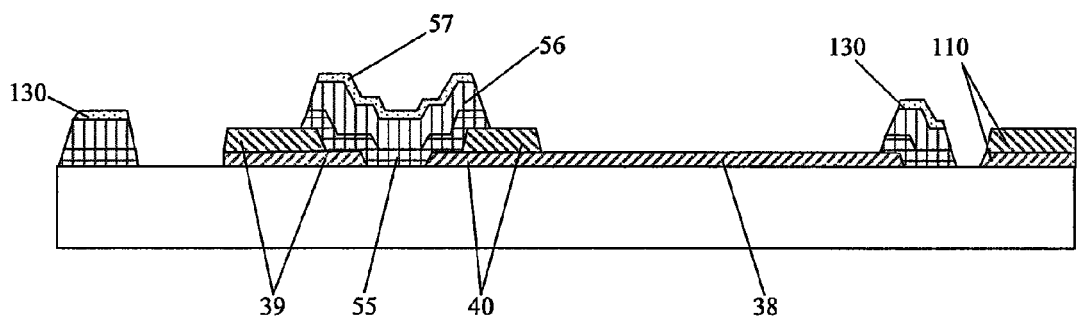
FIG. 15 is a schematic view showing removing of the residual photoresist in the embodiment of the invention.

As shown in FIG. 15, the residual photoresist is removed and a gate electrode layer is formed. That is, the source electrode 39, the drain electrode 40, the semiconductor layer 55, the gate insulation layer 56 and the gate electrode 57 of the thin film transistor in the top-gate, bottom-contact configuration are formed, and the gate line 130 and the data line 110 of the array substrate are formed.

Figure 16:
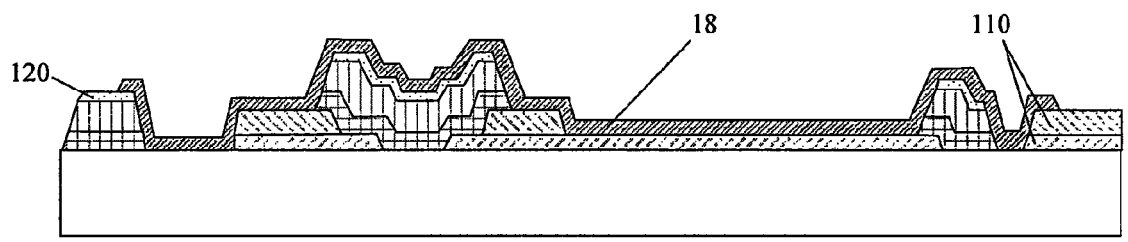
FIG. 16 is a schematically cross-sectional view showing formation of a passivation layer in the embodiment of the invention.
Figure 17:
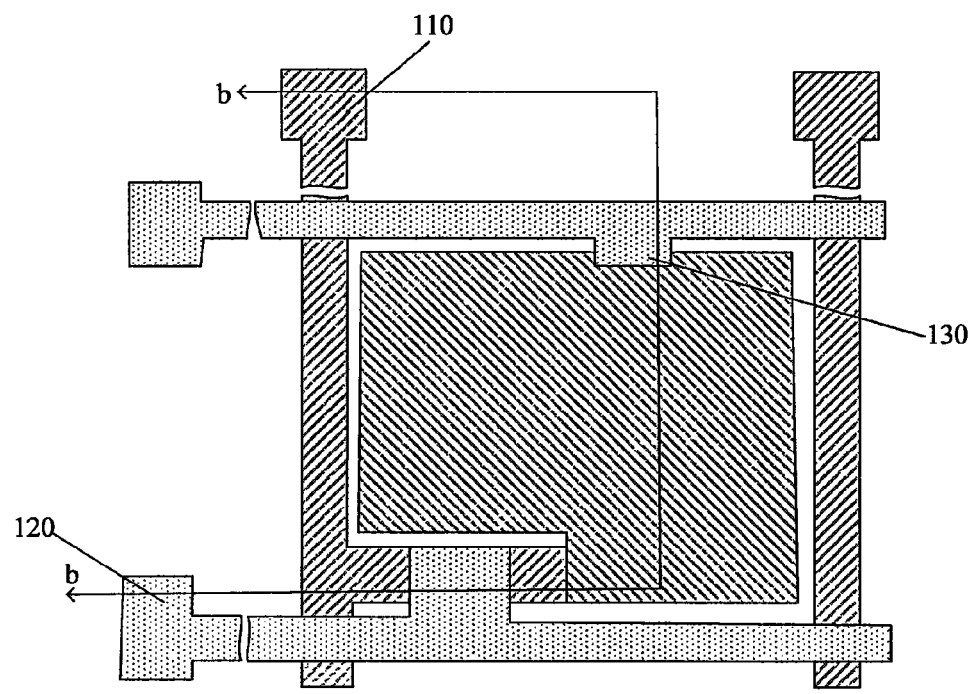
FIG. 17 is a schematically plan view showing formation of the passivation layer in the embodiment of the invention.

Further, as shown in FIGS. 16 and 17, a passivation layer 18 and passivation layer via holes are formed on the gate electrode layer through a third patterning process.

The material for the passivation layer is deposited on the source-drain electrode layer formed as above, and the passivation layer is formed, for example, of silicon oxide, silicon nitride, silicon oxynitride or an organic insulation material. After that, a layer of photoresist is coated, exposed and developed with a mask plate, and then an etching process is conducted so as to form the passivation layer 18. An external signal terminal region of the gate line 130 (a gate line PAD region 120) and an external signal terminal region of the data line 110 (a data line PAD region) are not covered with the passivation layer 18, that is, the passivation layer via holes are formed. Up to this point, the manufacture of the array substrate is completed.

According to the method for manufacturing the array substrate provided by the embodiment of the invention, with the use of a gray-tone or half-tone mask plate, the source and drain electrodes of the thin film transistor in the top-gate, bottom-contact configuration and the pixel electrode and the data line of the array substrate are formed in the first patterning process in a creative way. The source and drain electrodes are configured in two layers, and the bottom layers thereof are longer than the upper layers, so that the contact areas between the pattern of the source and drain electrodes and the pattern of the semiconductor layer of the organic thin film transistor in the top-gate, bottom-contact configuration is increased. Moreover, the gate line of the array substrate and the semiconductor layer, the gate insulation layer and the gate electrode of the thin film transistor are formed in the second patterning process, and finally, the passivation layer is further formed by using a patterning process; thus the manufacture of the array substrate is completed with the use of only three patterning processes. As compared to a manufacturing method in prior art, the use number of the patterning process is decreased while the properties of the array substrate are ensured, and then the damage of the patterning process upon the semiconductor thin film is reduced. Furthermore, the process step is simplified, and the production cost is reduced.

According to an embodiment of the invention, there is further provided a display device, comprising the array substrate as stated above. The display device may be a liquid crystal panel, an electronic paper, an OLED panel, a liquid crystal television, a liquid crystal display, a digital photo frame, a cell phone, a tablet computer or other product or component having a display function.

The forgoing description is merely related to exemplary embodiments of the invention, but is not used to limit protection scope of the invention. The protection scope of the invention is defined by the attached claims.

The invention claimed is:

1. An array substrate, comprising: a substrate, and a gate line, a data line, a thin film transistor and a pixel electrode which are located on the substrate, wherein the thin film transistor is a thin film transistor in a top-gate, bottom-contact configuration, and of the thin film transistor in the top-gate, bottom-contact configuration, a gate electrode is connected to the gate line, a source electrode is connected to the data line, and a drain electrode is connected to the pixel electrode, wherein the drain electrode of the thin film transistor is composed of upper, lower electrodes in two layers respectively, and the lower electrode of the drain electrode and the pixel electrode are of an integral construction and disposed in a same layer, the data line includes upper and lower conductive materials in two layers, the conductive materials in two layers are the same as the materials of the source and drain electrodes of the thin film transistor in the top-gate, bottom-contact configuration and the pixel electrode, respectively, the upper layer of data line and the upper electrode of the drain electrode are in a same layer, and the upper electrode of the drain electrode and the pixel electrode are not in a same layer.

2. The array substrate claimed as claim 1, wherein each of the source electrode and the drain electrode of the thin film transistor in the top-gate, bottom-contact configuration is composed of upper and lower electrodes in two layers respectively, and one end of the lower electrode contacting a semiconductor layer of the thin film transistor in the top-gate, bottom-contact configuration partially sticks out from the upper electrode.

3. The array substrate claimed as claim 1, wherein the thin film transistor in the top-gate, bottom-contact configuration is an organic thin film transistor in the top-gate, bottom-contact configuration.

4. A display device comprising the array substrate claimed as claim 1.

5. The array substrate claimed as claim 2, wherein the data line, the lower electrode of the source electrode, the lower electrode of the drain electrode, and the pixel electrode are disposed in a same layer.

6. A method for manufacturing an array substrate, comprising:
    forming a pattern including source and drain electrodes, a pixel electrode and a data line on a substrate through a first patterning process;
    forming a pattern including a semiconductor layer, a gate insulation layer, a gate electrode and a gate line through a second patterning process on the substrate subjected to the first patterning process; and
    forming a pattern including a passivation layer and a passivation layer via hole through a third patterning process on the substrate subjected to the second patterning process,
    wherein forming of the pattern including the source and drain electrodes, the pixel electrode and the data line on the substrate through the first patterning process includes:
    forming a transparent conductive film and a metal film on the substrate in sequence;
    coating a layer of photoresist on the metal film;
    performing exposure and development on the photoresist with a half-tone or gray-tone mask plate so as to form a fully-retained area, a partially-retained area and a fully-removal area, the fully-retained area being adapted for formation of a pattern of the source and drain electrodes of a thin film transistor and a pattern of the data line, the partially-retained area being adapted for formation of a pattern of the pixel electrode and a semiconductor contact area which functions to make the pattern of the source and drain electrodes of the thin film transistor sufficiently contact with the pattern of the semiconductor layer of the thin film transistor;
    removing the transparent conductive film and the metal film in the fully-removal area through an etching process, so as to form a pattern of the pixel electrode, a pattern of the data line, and lower patterns of the source and drain electrodes for forming patterns of the source electrode and drain electrode;
    removing the photoresist in the partially-retained area through an ashing process;
    removing the metal film in the partially-retained area through an etching process, so that the pixel electrode is exposed, and meanwhile, upper patterns of the source electrode and the drain electrode are formed, wherein the upper patterns of the source electrode and the drain electrode and the lower patterns of the source and drain electrodes together constitute patterns of the source and drain electrodes of the thin film transistor, and a lower electrode of the drain electrode and the pixel electrode are of an integral construction and disposed in a same layer, the data line includes upper and lower conductive materials in two layers, and the conductive materials in two layers are the same as the materials of the source and drain electrodes of the thin film transistor in the top-gate, bottom-contact configuration and the pixel electrode, respectively, the upper layer of data line and the upper electrode of the drain electrode are in a same layer, and the upper electrode of the drain electrode and the pixel electrode are not in a same layer; and
    removing residual photoresist.

7. The method claimed as claim 6, wherein forming of the pattern including the semiconductor layer, the gate insulation layer, the gate electrode and the gate line on the substrate subjected to the first patterning process through the second patterning process comprises:
    forming a layer of a semiconductor material, a layer of an insulation material and a layer of a metal material on the substrate subjected to the first patterning process in sequence;
    coating a layer of photoresist on the layer of the metal material;
    performing exposure and development on the photoresist so as to form a retained area and a removal area of photoresist, the retained area corresponding to a region in which the pattern including the semiconductor layer, the gate insulation layer, the gate electrode and the gate line is to be formed;
    removing the semiconductor material, the insulation material and the metal material in the removal area through an etching process so as to form the pattern including the semiconductor layer, the gate insulation layer, the gate electrode and the gate line; and
    removing the residual photoresist.

8. The method claimed as claim 7, wherein the layer of the semiconductor material is of an organic semiconductor material.

* * * * *